United States Patent [19]
Gober

[11] Patent Number: 5,893,770
[45] Date of Patent: Apr. 13, 1999

[54] RETENTION MEMBER FOR ZERO INSERTION FORCE SOCKET

[75] Inventor: Alan Gober, Austin, Tex.

[73] Assignee: Dell USA, L.P., Round Rock, Tex.

[*] Notice: Under 35 U.S.C. 154(b), the term of this patent shall be extended for 564 days.

[21] Appl. No.: 08/515,218

[22] Filed: Aug. 15, 1995

Related U.S. Application Data

[63] Continuation of application No. 08/154,047, Nov. 17, 1993, abandoned.

[51] Int. Cl.$^6$ .................................................. H01R 13/629
[52] U.S. Cl. ...................................... 439/342; 439/331
[58] Field of Search .................................. 439/261, 263, 439/264, 331, 342

[56] References Cited

U.S. PATENT DOCUMENTS

| | | | |
|---|---|---|---|
| 4,278,311 | 7/1981 | Scheingold et al. | 439/331 |
| 5,244,404 | 9/1993 | Kishi et al. | 439/331 |
| 5,256,080 | 10/1993 | Bright | 439/342 |

OTHER PUBLICATIONS

IBM Technical Disclosure, Bruder, vol. 13, No. 5, p. 1265, Oct. 1970.

IBM Technical Disclosure, Jarvela, vol. 16, No. 12, p. 3975, May 1974.

*Primary Examiner*—Neil Abrams
*Attorney, Agent, or Firm*—Skjerven, Morrill, MacPherson, Franklin & Friel, L.L.P.; Stephen A. Terrile

[57] ABSTRACT

A projection extending substantially perpendicularly from an arm or lever of a zero insertion force (ZIF) socket serves as a retention member for a component assembly in the ZIF socket. The ZIF socket comprises: a body having a plurality of electrical contact apertures for receiving a plurality of component assembly pins from a component assembly placed over the body; a binding member located below and slidably coupled to the body allowing insertion in and extraction of the pins from the plurality of electrical contact apertures of the body when the binding member is in a first position relative to the body, and retaining the plurality of component assembly pins when the binding member is in a second position relative to the body; and a first arm member rotatably coupled to the binding member for positioning the binding member relative to the body. The retention member comprises a first projection extending substantially perpendicularly from the first arm and extending over a portion of the electronic component to provide a retention force toward the body.

20 Claims, 3 Drawing Sheets

RETENTION MEMBER FOR ZERO INSERTION FORCE SOCKET

This is a continuation of application Ser. No. 08/154,047, filed Nov. 17, 1993 and now abandoned.

TECHNICAL FIELD OF THE INVENTION

The present invention is directed, in general, to computer circuitry and, more specifically, to a retention member for use in conjunction with a zero insertion force ("ZIF") socket to provide additional retention force.

BACKGROUND OF THE INVENTION

In the early days of personal computers ("PC"s), microprocessor central processing units ("CPU"s) and other major electronic components thereof were soldered directly to a circuit board. Although this was a cost-efficient mounting method as far as manufacturing was concerned, there were several major drawbacks. First, heat generated during the soldering process sometimes overheated the components, rendering them useless or limiting their lifetime. Although soldering techniques improved over the years, such overheating remained a concern. Second, if the component was found faulty during a later-performed test, the component had to be unsoldered from the circuit board and a new one resoldered in its place, again with the risk of heat overexposure during soldering. As the components grew more integrated and sophisticated, pin count increased, increasing heat delivered to the component during soldering and greatly complicating component replacement.

Because of the above-discussed deficiencies of direct solder-mounting of components, low insertion force ("LIF") sockets were developed. LIF sockets were designed to be directly soldered to the circuit board in lieu of a component. LIF sockets provided a plurality of apertures on an upper surface thereof for receiving the component pins. Each of the apertures contained a spring-loaded contact that frictionally gripped each pin as it was inserted. The combined frictional force of all of the spring-loaded contacts on the component pins retained the component in the socket and provided for good electrical contact between the component pins and those on the LIF socket.

As component size and pin count continued to grow, however, LIF sockets became problematical. Each spring-loaded contact in the LIF socket required a certain amount of spring force to maintain good electrical contact. However, as pin count grew, the total spring and frictional force also grew. At some point, the combined frictional force of all of the spring-loaded contacts made insertion or extraction of the component from the LIF socket difficult. Sometimes, the required insertion force bent or folded slightly misaligned component pins, placing the entire component at risk. If the insertion or extraction force was not applied uniformly, pins were at risk of being bent or broken. The design of many-apertured LIF sockets required keeping individual aperture friction to a minimum to keep total insertion or extraction force to a practical level. However, a sufficient amount of spring-loading in each aperture was needed to maintain reliable electrical contact. Often, a special-purpose component removal tool was required for extracting many-pinned components (particularly microprocessor CPUs) from LIF sockets.

Today's PCs are often designed to operate with improved components as they are developed. For example, as an improved microprocessor becomes available, a user wishing to increase PC performance need only replace the existing microprocessor with an upgraded model. Unfortunately, many users lack the dexterity, gentility, strength and confidence necessary to install many-pinned components in LIF sockets. Thus, the many users that would benefit from the increased performance of a component upgrade are deterred from undergoing the transition.

In response to the user's concern, PCs are beginning to be equipped with zero insertion force ("ZIF") sockets to eliminate a need for the user to apply substantial insertion or extraction forces to upgrade components. Like LIF sockets, ZIF sockets are designed to be directly soldered to the circuit board. ZIF sockets also provide a plurality of apertures on an upper surface thereof for receiving the component pins. Unlike LIF sockets, the apertures do not contain spring-loaded contacts, but accept each component pin without substantial frictional resistance. An arm is rotatably mounted to the ZIF socket. Rotation of the arm causes a relative translation of portions of the ZIF socket with respect to each other. The portions place the component pins in a mechanical shear or bind within the apertures. The mechanical bind brings about a good electrical contact for each of the component pins. The combined mechanical bind of all of the apertures presents a substantial retention force to hold the component in the ZIF socket. Unlike LIF sockets, ZIF sockets do not need to sacrifice individual aperture retention force and concomitant electrical contact integrity to keep total insertion or extraction forces to an acceptable level. Thus ZIF sockets therefore typically have high retention forces relative to LIF sockets.

As components have increased in size and power density, it has become attractive to pair the larger components, particularly the microprocessor CPU, with a heat sink. Typically, this is done by providing a retention clip that wraps around the heat sink and grasps the component on its underside. The component and the heat sink therefore become a single assembly that can be inserted or extracted from a LIF or ZIF socket in a single step. Unfortunately, heat sink/component assemblies are relatively heavy. This becomes most disadvantageous when the PC is transported. As the PC is rotated, bumped and jarred, the weight of the heat sink/component assembly generates forces sufficient to dislodge the assembly from its socket. If forces are of sufficient strength, even components that do not have a heat sink attached may generate enough force to become dislodged from a ZIF socket.

Accordingly, what is needed in the art is a structure for providing additional component retention forces in a ZIF socket to minimize a probability of component movement or detachment while locked in the socket.

SUMMARY OF THE INVENTION

To address the above-discussed deficiencies of the prior art, it is a primary object of the present invention to provide a means by which to exert additional retention forces on a heat sink/integrated circuit assembly to lessen the chance of the assembly becoming disengaged from the ZIF socket, particularly during transportation of the computer.

In the attainment of the above-described primary object, the present invention provides a retention member for use in conjunction with a ZIF socket. The socket comprises: (1) a body having a surface, the surface having a plurality of electrical contact apertures therein for receiving a corresponding plurality of electrical contact pins from an electronic circuit placed over the surface, (2) a binding member slidably coupled to the body, the binding member allowing insertion and extraction of the plurality of pins from the plurality of apertures when the binding member is in a first position relative to the body, the binding member retaining the plurality of pins in the plurality of apertures when the binding member is in a second position relative to the body and (3) a first arm member rotatably coupled to the binding member for positioning the binding member relative to the body as a function of a position of the first arm member. The retention member comprises a first projection extending from the first arm member and over a portion of the surface, the first projection providing a retention force toward the surface to thereby resiliently urge an object toward the surface. In a preferred embodiment, the object is a heat sink/microprocessor assembly.

One advantage of the above structure is that the arm member is employed to provide part of the retention force. Previously, the force of the binding member pinching on the circuit pins provided all of the retention force.

Most ZIF sockets are provided with a latch member coupled to the body that releasably locks the first arm member in a position substantially parallel to the body, in which the ZIF socket is closed. The present invention is particularly well suited to take advantage of the positive locking engagement of the latch member by employing the latch member to provide a portion of the retention force to the first projection when the latch member engages with the first arm member. In such ZIF sockets, the latch is disengaged by displacing the first arm member outward with respect to the body, the latch member separating from the first arm member and freeing the first arm member to rotate upwards to an open position.

In a preferred embodiment of the present invention, the ZIF socket retains a heat sink/integrated circuit assembly. The first projection resiliently urges the heat sink against the circuit to remove heat from the circuit. In such an assembly, the circuit is most often a microprocessor CPU of a PC. A retention clip couples the heat sink to the circuit. Thus, the heat sink and the circuit can be removed from the ZIF socket without the use of a removal tool and in a single move of the ZIF socket first arm member.

In an alternative embodiment, there is no heat sink covering the circuit. In this embodiment, the first projection comes into direct contact with the circuit, urging it downward. Thus, in the vernacular used above, the "object" is the package that is molded about and contains the circuit.

Some ZIF sockets employ dual arm members disposed on either side of the body and coupled together so as to move in conjunction with one another. In such sockets, a second arm member is rotatably coupled to the body to move in parallel with the first arm member. This provides for more symmetrical forces on the binding member as it is urged into its second position. The present invention operates with this socket by providing a second projection that extends from the second arm member and over a further portion of the surface. The second projection provides an additional retention force toward the surface.

Alternatively, the first projection extends from the first arm member to the second arm member, the first and second arm members cooperating to provide the retention force toward the surface. Thus, a single projection can bridge the two arm members to provide retention force. This eliminates torques brought about when separate or single projections are cantilevered over the surface.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
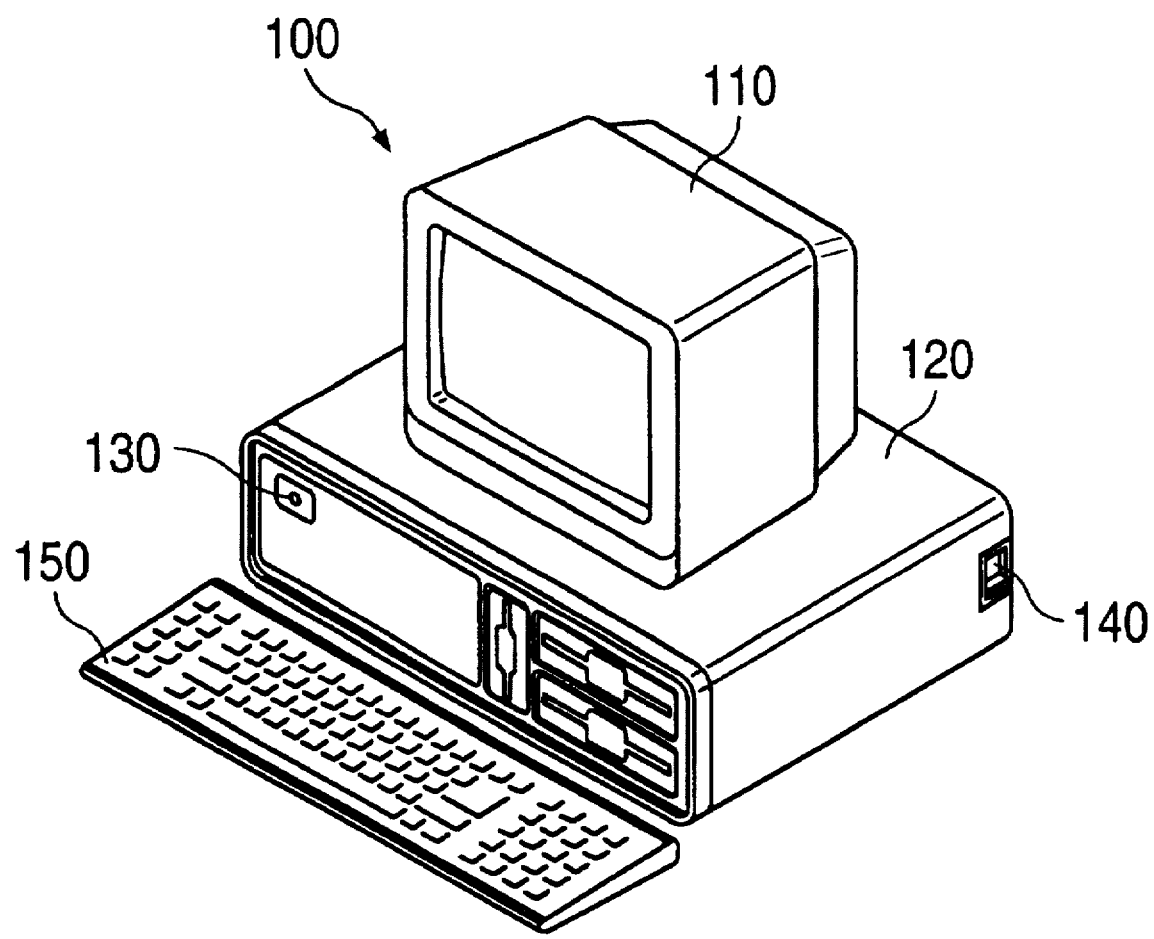
FIG. 1 illustrates an isometric view of a personal computer that provides an environment within which the present invention can operate.

Referring initially to FIG. 1, illustrated is an isometric view of a PC 100 that provides an environment within which the present invention can operate. Since the present invention is not limited to application in a PC environment, however, FIG. 1 is illustrative only. The PC 100 includes a monitor 110, a main chassis 120, within which are various electronic components of the computer (not shown, but including the microprocessor CPU) and a keyboard 150. The monitor 110 and the keyboard 150 cooperate to allow communication between the PC 100 and a user. The main chassis 120 includes a dedicated hardware reset switch 130 adapted to trigger hardware reset circuitry (not shown) within the main chassis 120 to "reboot" or restart the PC 100 when the user depresses the reset switch 130. The main chassis 120 further includes a power switch 140 that is capable of interrupting power to the PC 100.

Figure 2:
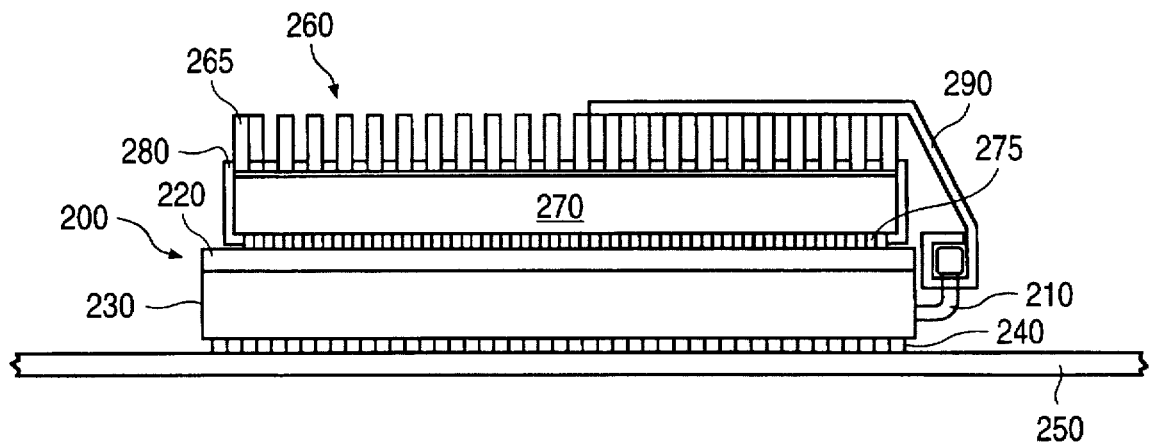
FIG. 2 illustrates a front elevational view of the projection of the present invention employed in conjunction with a ZIF socket having a single arm member.

Turning now to FIG. 2, illustrated is a front plan view of the projection of the present invention employed in conjunction with a ZIF socket 200 having a single arm member 210. The ZIF socket 200 comprises a body 220 and a binding member 230 slidably coupled to the body 220 to allow relative linear motion therebetween. Relative linear motion between the body 220 and the binding member 230 opens or closes the ZIF socket 200. The single arm member 210 is rotatable between a first position wherein the arm member 210 is rotated away from the plane of the ZIF socket 200 and a second position wherein the arm member 210 is substantially coplanar with the ZIF socket 200. The second position is shown in FIG. 2. Rotation of the arm member 210 causes the relative linear motion between the body 220 and the binding member 230 via a cam or gear arrangement. It is conventional to provide that the first position opens the ZIF socket 200 for insertion or extraction of the component and the second position closes the ZIF socket 200. The ZIF socket is provided with a plurality of electrical pin contacts 240 that are solder-mounted on a circuit board 250 for electrical communication with traces (not shown) on the circuit board. A heat sink 260 having a plurality of heat dissipating fins 265 or projections on an upper surface thereof is coupled to a heat-producing component 270 by a retention clip 280. The heat sink 260/component 270 is referred to jointly as an "assembly." The component 270 has a plurality of electrical contact pins 275 on a lower surface thereof. The pins 275 are received into a plurality of apertures on an upper surface of the ZIF socket body 220. When the assembly is seated in the ZIF socket 200, the pins 275 are located proximate to electrical contacts located in the apertures of the ZIF socket. When the arm member 210 is brought into its second, closed position, the component pins 275 are pinched or bound within the apertures of the ZIF socket 200, frictionally locking the pins 275 therein, thereby providing a retention force.

The present invention introduces an additional retention force by providing a projection 290 that wraps around or is integrally formed with the arm member 210. As shown in FIG. 2, the projection 290 rises from the arm member 210 and extends over at least a portion of the upper surface of the heat sink 260, urging the heat sink 260 downward and toward engagement with the ZIF socket 200.

As the arm member 210 swings upward to its first position, the projection 290 swings with it, rising from the upper surface of the heat sink 260 and rotating out of the way of the heat sink 260. This frees the heat sink 260/component 270 to be removed from the ZIF socket 200.

Figure 3:
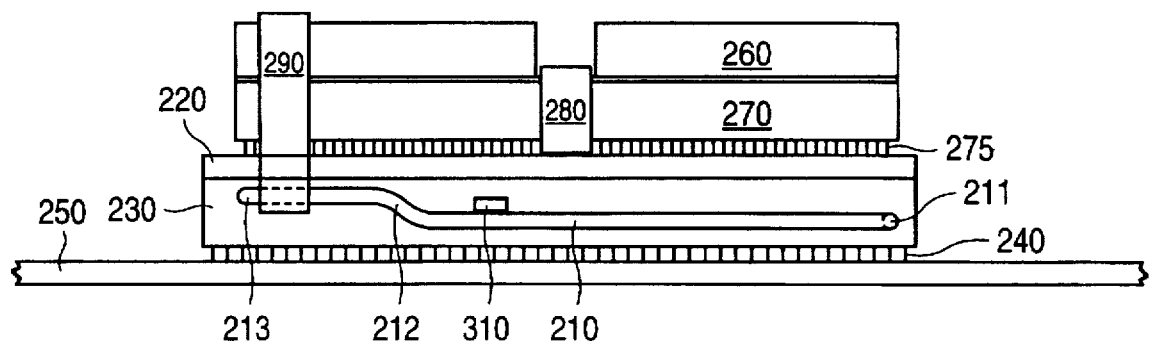
FIG. 3 illustrates a right side elevational view of the projection/single arm member ZIF socket of FIG. 2.

Turning now to FIG. 3, illustrated is a right side plan view of the projection/single arm member ZIF socket of FIG. 2. FIG. 3 is primarily presented for the purpose of detailing the arm member 210 and the projection 290. The arm member 210 comprises a pivot 211 and a bent portion 212 terminating in a handle 213. The present invention, in the illustrated embodiment, uses the handle 213 as a mount for the projection 290, although the projection 290 can be mounted or integrally formed on the part of the arm member 210 between the pivot 211 and the bent portion 212.

Also shown in FIG. 3 is a latch member 310 jutting outwardly from a side of the ZIF socket 200. The latch member 310 has a sloping upper side and a horizontal lower side. The latch member 310 operates in a conventional manner to secure the arm member 210 in its second, closed position by urging the arm member 210 slightly away from the ZIF socket 200 as the arm member 210 comes into contact with the upper surface of the latch member 310 as the arm member 210 descends. The arm member 210 then springs back toward the ZIF socket 200 and into positive locking engagement with the lower surface of the latch member 310 when the arm member 210 drops below the latch member 310. The latch member 310 cooperates with the present invention by providing at least a portion of the retention force that the projection 290 places on the heat sink 260. The arm member 210 is disengagable from the latch member 310 by urging the arm member away from the ZIF socket 210 until the arm member disengages from the lower surface of the latch member 310. The arm member 210 is now free to rotate upward.

Figure 4:
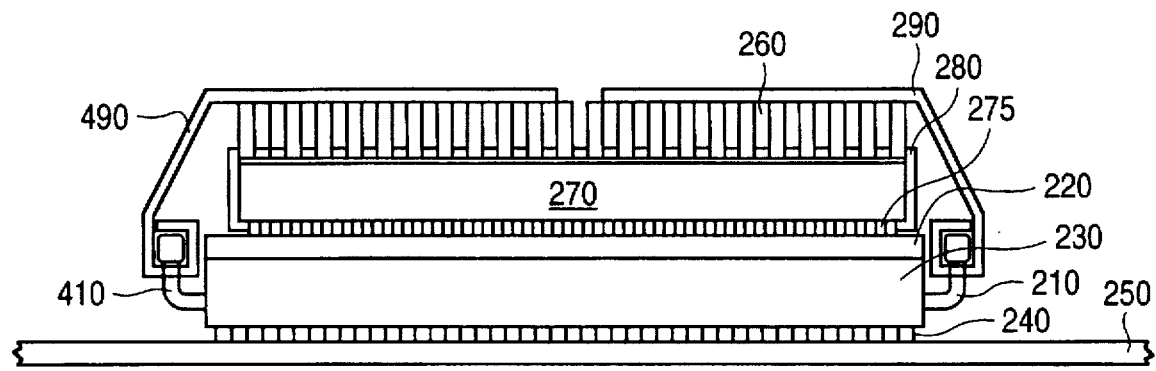
FIG. 4 illustrates a front elevational view of dual projections of the present invention employed in conjunction with a ZIF socket having dual arm members.

Turning now to FIG. 4, illustrated is a front plan view of dual projections of the present invention employed in conjunction with a ZIF socket having dual arm members. FIG. 4 is presented primarily for the purpose of showing how the present invention is adapted for use with a dual-armed ZIF socket. Accordingly, a second arm member 410 extends from a left side of the ZIF socket 200, as shown. The second arm member 410 is preferably coupled to the first arm member 210 by a common axle shaft running a width of the ZIF socket. Some dual-armed ZIF sockets further join the handles of the first and second arm members 210, 410 with a member that spans a front side of the ZIF socket 200 for added structural integrity to provide a greater area to grasp manually to rotate the first and second arm members 210, 410. The present invention contemplates the optional addition of a second projection 490 extending upward from the second arm member 410 and over a second portion of the heat sink 260. Again, the second projection 490 can be a separate member wrapped around a portion of the second arm member 410 or can be integrally formed with the second arm member 410 as a single casting, molding or forging. The result of the added second projection 490 is added retention force for the assembly and an added degree of symmetry to the additional retention force.

Figure 5:
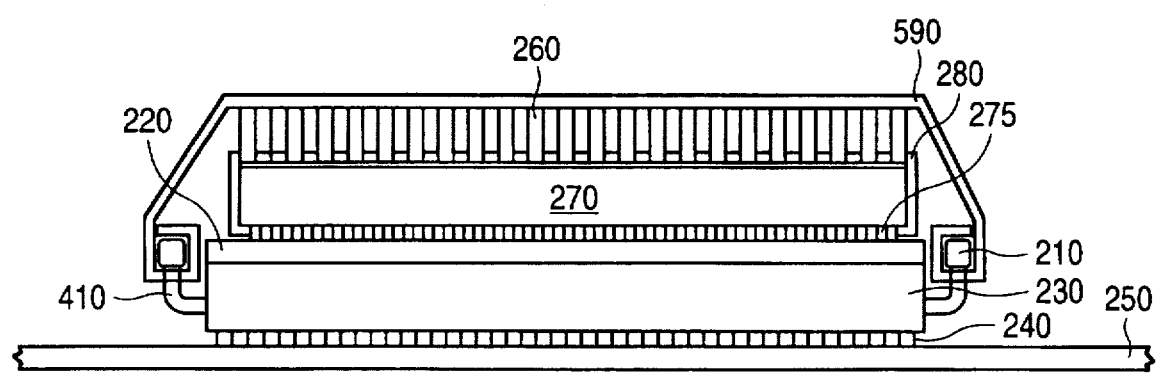
FIG. 5 illustrates a front elevational view of a single projection of the present invention employed in conjunction with a ZIF socket having dual arm members.

Turning now to FIG. 5, illustrated is a front plan view of a single projection of the present invention employed in conjunction with a ZIF socket having dual arm members. In this embodiment, the present invention essentially joins the separate first and second projections 290, 490 of FIG. 4 into a single projection 590 spanning the entire distance between the first and second arm members 210, 410. This single projection 590 structure is capable of placing more retention force on the heat sink 260, since there are no torques placed on the single projection 590 by cantilevering, as in the previously-described embodiments.

Those skilled in the art will recognize that there are useful variations on the abovedescribed invention. First, the projection can be modified to retain a component in the absence of an associated heat sink by providing a projection of lower profile. Second, the projection can be made of metal or plastic and can be of different width or thickness, depending upon material strength or retention force requirements.

From the above description, it is apparent that the present invention provides a retention member for use in conjunction with a ZIF integrated circuit socket. The socket comprises: (1) a body having a surface, the surface having a plurality of electrical contact apertures therein for receiving a corresponding plurality of electrical contact pins from an electronic circuit placed over the surface, (2) a binding member slidably coupled to the body, the binding member allowing insertion and extraction of the plurality of pins from the plurality of apertures when the binding member is in a first position relative to the body, the binding member retaining the plurality of pins in the plurality of apertures when the binding member is in a second position relative to the body and (3) a first arm member rotatably coupled to the body for positioning the binding member relative to the body as a function of a position of the first arm member. The retention member comprises a first projection extending from the first arm member and over a portion of the surface, the first projection providing a retention force toward the surface to thereby resiliently urge an object toward the surface.

Although the present invention and its advantages have been described in detail, it should be understood that various changes, substitutions and alterations can be made herein without departing from the spirit and scope of the invention as defined by the appended claims.

What is claimed is:

1. A zero insertion force socket comprising:

a body having an upper surface and a lower surface, the body having a plurality of electrical contact apertures extending from the upper surface to the lower surface for receiving a corresponding plurality of component assembly pins from an component assembly placed over the upper surface;

a binding member located below the body and being slidably coupled to the body whereby the binding member allows insertion of the plurality of component assembly pins in and extraction of the plurality of component assembly pins from the plurality of electrical contact apertures of the body when the binding member is in a first position relative to the body, the binding member retaining the plurality of component assembly pins when the binding member is in a second position relative to the body;

a first arm member rotatably coupled to the binding member so that rotation of the first arm member causes a relative motion between the body and the binding member; and a first projection extending generally perpendicularly from the first arm member and extending over a portion of the component assembly, the first projection providing a retention force toward the upper surface of the body to thereby resiliently urge the component assembly toward the upper surface of the body.

2. The zero insertion force socket of claim 1 wherein the binding member further comprises:

a latch releasably engaging the first arm member in a position generally parallel to the body, the position generally parallel to the body corresponding to the binding member being in the second position relative to the body.

3. The zero insertion force socket of claim 2 wherein the latch is disengaged by displacing the first arm member outward with respect to the body, thereby separating the latch from the first arm member.

4. The zero insertion force socket of claim 1 wherein the component assembly is an integrated circuit device.

5. The zero insertion force socket of claim 1 wherein the component assembly is an integrated circuit device with an attached heat dissipating device.

6. The zero insertion force socket of claim 1, further comprising:

a second arm member rotatably coupled to the binding member so that rotation of the second arm member causes a relative motion between the body and the binding member, the second arm member rotatably coupled to the binding member so as to move in parallel with the first arm member; and a second projection extending generally perpendicularly from the second arm member and extending over a portion of the component assembly, the second projection providing a retention force toward the upper surface of the body to thereby resiliently urge the component assembly toward the upper surface of the body.

7. The zero insertion force socket of claim 6 wherein the first projection and the second projection provide a single projection extending generally perpendicularly from the first arm member to the second arm member and extending over a portion of the component assembly.

8. A method of providing a retention force in a zero insertion force socket, comprising the steps of:

receiving a plurality of component assembly pins from a component assembly into a plurality of electrical contact apertures extending from an upper surface to a lower surface of a body;

rotating a first arm member, rotatably coupled to a binding member, thereby causing a relative motion between the body and the binding member, the body and the binding member being slidably coupled, the binding member allowing insertion and extraction of the plurality of component assembly pins into and out of the plurality of electrical contact apertures of the body when the binding member is in a first position relative to the body, the binding member retaining the plurality of component assembly pins when the binding member is in a second position relative to the body; and retaining the component assembly with a first projection extending generally perpendicularly from the first arm member and extending over a portion of the component assembly, the first projection providing a retention force toward the upper surface of the body.

9. The method of claim 8 further comprising the step of:

releasably engaging the first arm member with a latch coupled to the binding member, the latch engaging the first arm in a position generally parallel to the body, the position generally parallel to the body corresponding to the binding member being in the second position relative to the body.

10. The method of claim 9 wherein releasably engaging the first arm member further comprises the step of:

engaging the first arm member with the latch by displacing the first arm member outward with respect to the body while lowering the first arm member to a level below that of the latch and subsequently allowing the first arm member to return to a position inward with respect to the body.

11. The method of claim 8 wherein the component assembly is an integrated circuit device.

12. The method of claim 8 wherein the component assembly is an integrated circuit device with an attached heat dissipating device.

13. The method of claim 8 further comprising the steps of:

rotating a second arm member, rotatably coupled to the binding member so that rotation of the second arm member causes a relative motion between the body and the binding member, the second arm member rotatably coupled to the binding member so as to move in parallel with the first arm member; and retaining the component assembly with a second projection extending generally perpendicularly from the second arm member and extending over a portion of the component assembly, the second projection providing a retention force toward the upper surface of the body.

14. The method of claim 13 wherein the first projection and the second projection are joined together to form a single projection extending generally perpendicularly from the first arm member to the second arm member and extending over a portion of the component assembly.

15. A computer system comprising:

a circuit board with a zero insertion force socket;

a processor inserted in the zero insertion force socket; and a memory coupled to the processor through the zero insertion force socket, the zero insertion force socket further comprising:

a body having an upper surface and a lower surface, the body having a plurality of electrical contact apertures extending from the upper surface to the lower surface for receiving a corresponding plurality of component assembly pins from the processor placed over the upper surface;

a binding member located below the body and being slidably coupled to the body whereby the binding member allows insertion of the plurality of component assembly pins in and extraction of the plurality of component assembly pins from the plurality of electrical contact apertures of the body when the binding member is in a first position relative to the body, the binding member retaining the plurality of component assembly pins when the binding member is in a second position relative to the body;

a first arm member rotatably coupled to the binding member so that rotation of the first arm member causes a relative motion between the body and the binding member; and a first projection extending generally perpendicularly from the first arm member and extending over a portion of the processor, the first projection providing a retention force toward the upper surface of the body to thereby resiliently urge the processor toward the upper surface of the body.

16. The computer system of claim 15 wherein the binding member of the zero insertion force socket further comprises:

a latch releasably engaging the first arm member in a position generally parallel to the body, the position generally parallel to the body corresponding to the binding member being in the second position relative to the body.

17. The computer system of claim 16 wherein the latch is disengaged by displacing the first arm member outward with respect to the body, thereby separating the latch from the first arm member.

18. The computer system of claim 15 wherein the processor includes an attached heat dissipating device.

19. The computer system of claim 15 wherein the zero insertion force socket further comprises:

a second arm member rotatably coupled to the binding member so that rotation of the second arm member causes a relative motion between the body and the binding member, the second arm member rotatably coupled to the binding member so as to move in parallel with the first arm member; and a second projection extending generally perpendicularly from the second arm member and extending over a portion of the processor, the second projection providing a retention force toward the upper surface of the body to thereby resiliently urge the processor toward the upper surface of the body.

20. The computer system of claim 15 wherein the first projection and the second projection of the zero insertion force socket are joined together to form a single projection extending generally perpendicularly from the first arm member to the second arm member and extending over a portion of the processor.

* * * * *